(12) United States Patent
Sai

(10) Patent No.: US 11,437,566 B2
(45) Date of Patent: Sep. 6, 2022

(54) PIEZOELECTRIC SUBSTRATE MANUFACTURING DEVICE AND PIEZOELECTRIC SUBSTRATE MANUFACTURING METHOD

(71) Applicant: Murata Manufacturing Co., Ltd., Nagaokakyo (JP)

(72) Inventor: Koki Sai, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 420 days.

(21) Appl. No.: 16/789,853

(22) Filed: Feb. 13, 2020

(65) Prior Publication Data

US 2020/0185593 A1 Jun. 11, 2020

Related U.S. Application Data

(63) Continuation of application No. PCT/JP2018/035951, filed on Sep. 27, 2018.

(30) Foreign Application Priority Data

Sep. 29, 2017 (JP) .............................. JP2017-190599

(51) Int. Cl.
*H01L 41/47* (2013.01)
*H01L 21/66* (2006.01)
*H01L 41/29* (2013.01)

(52) U.S. Cl.
CPC .............. *H01L 41/47* (2013.01); *H01L 22/12* (2013.01); *H01L 22/24* (2013.01); *H01L 41/29* (2013.01)

(58) Field of Classification Search
None
See application file for complete search history.

(56) References Cited

U.S. PATENT DOCUMENTS 5,543,336 A * 8/1996 Enami ................. H01L 21/3003
438/528
6,646,277 B2 * 11/2003 Mack .................... H01J 37/026
250/492.23

(Continued)

FOREIGN PATENT DOCUMENTS

JP          05190499 A       7/1993
JP        2007214215 A       8/2007

(Continued)

OTHER PUBLICATIONS

International Search Report issued for PCT/JP2018/035951, dated Dec. 18, 2018.

(Continued)

*Primary Examiner* — Bo B Jang
(74) *Attorney, Agent, or Firm* — ArentFox Schiff LLP

(57) ABSTRACT

A piezoelectric substrate manufacturing device that includes first and electrodes that face each other with a piezoelectric substrate interposed therebetween; a cover that surrounds the second electrode such that the leading end of the second electrode is exposed; a supply unit that supplies a processing gas to an internal space of the cover; a processing unit that performs surface processing on the piezoelectric substrate by applying a voltage between the first and second electrodes causing the processing gas to change into plasma; a detector that is provided outside the cover with its relative position fixed with respect to the second electrode; a measurement unit that measures the thickness of the piezoelectric substrate using the detector; a driving unit that changes the relative positions of the first and second electrodes; and a control unit that controls the supply unit, the processing unit, the measurement unit, and the driving unit.

32 Claims, 7 Drawing Sheets

(56) References Cited

U.S. PATENT DOCUMENTS

| | | |
|---|---|---|
| 10,236,436 B2 | 3/2019 | Watanabe |
| 2003/0176069 A1* | 9/2003 | Yuasa .................... H01L 21/78 |
| | | 438/692 |
| 2006/0157445 A1* | 7/2006 | Mochiki ........... H01L 21/67069 |
| | | 216/58 |
| 2018/0047890 A1 | 2/2018 | Watanabe |
| 2022/0130639 A1* | 4/2022 | Doemer ............. G01N 23/2258 |

FOREIGN PATENT DOCUMENTS

| | | |
|---|---|---|
| JP | 2015146512 A | 8/2015 |
| WO | 2016158965 A1 | 10/2016 |

OTHER PUBLICATIONS

Written Opinion of the International Searching Authority issued for PCT/JP2018/035951, dated Dec. 18, 2018.

\* cited by examiner

US 11,437,566 B2

PIEZOELECTRIC SUBSTRATE MANUFACTURING DEVICE AND PIEZOELECTRIC SUBSTRATE MANUFACTURING METHOD

CROSS REFERENCE TO RELATED APPLICATIONS

The present application is a continuation of PCT/JP2018/035951 filed Sep. 27, 2018, which claims priority to Japanese Patent Application No. 2017-190599, filed Sep. 29, 2017, the entire contents of each of which are incorporated herein by reference.

TECHNICAL FIELD

The present invention relates to a piezoelectric substrate manufacturing device and a method for manufacturing a piezoelectric piece that forms a piezoelectric vibration element together with excitation electrodes.

BACKGROUND

Currently, a piezoelectric piece included in a piezoelectric vibration element is manufactured by cutting a piezoelectric substrate (for example, a piezoelectric wafer) into individual pieces. In a piezoelectric vibration element, such as a crystal vibration element that utilizes a thickness shear vibration mode, the thickness of the piezoelectric piece greatly affects the frequency characteristics of the piezoelectric vibration element. Therefore, it is demanded that improvements be made in terms of thickness accuracy in the piezoelectric substrate state.

For example, Patent Document 1 (identified below) discloses a crystal processing device that includes an electrode that is used to perform both measurement and processing. The crystal processing device acquires the thickness distribution of a piezoelectric substrate using the electrode and determines the amount of plasma etching to be performed using the electrode at each position of the electrode on the basis of the thickness distribution. Accordingly, since the same electrode and electrode positioning unit are used in the measurement step and the processing step, positional errors between the measurement step and the processing step are reduced and processing accuracy can be improved.
Patent Document 1: Japanese Unexamined Patent Application Publication No. 2015-146512.

However, since the same electrode is used to perform both measurement and processing in the configuration disclosed in Patent Document 1, the measurement electrode becomes contaminated by fumes generated in reactions with plasma, particles produced in ion collisions, and so forth, in the processing step. This contamination reduces the measurement accuracy. Moreover, when an attempt is made to restore measurement accuracy by washing the electrode, there is a problem in that the processing efficiency is reduced.

SUMMARY OF THE INVENTION

The present invention was made in light of the above-described circumstances. Accordingly, it is an object thereof to provide a piezoelectric substrate manufacturing device and a piezoelectric substrate manufacturing method that improves processing accuracy.

Therefore, a piezoelectric substrate manufacturing device is provided according to an exemplary aspect that includes a first electrode; a second electrode that faces the first electrode with a piezoelectric substrate interposed therebetween; a cover that surrounds the second electrode such that a leading end of the second electrode is exposed; and a supply unit that supplies processing gas to an internal space of the cover. Moreover, the exemplary manufacturing device includes a processing unit that performs surface processing on the piezoelectric substrate by applying a voltage between the first electrode and the second electrode and causing the processing gas to change into plasma; a detector that is provided outside the cover and that has a relative position with respect to the second electrode; a measurement unit that measures a thickness of the piezoelectric substrate using the detector; a driving unit that changes relative positions of the first electrode and the second electrode; and a control unit that controls the supply unit, the processing unit, the measurement unit, and the driving unit.

Moreover, a piezoelectric substrate manufacturing method is provide that includes arranging a piezoelectric substrate between a first electrode and a second electrode; measuring a thickness of the piezoelectric substrate using a detector that is provided outside a cover, which covers the second electrode such that a leading end of the second electrode is exposed and that has a relative position with respect to the second electrode; calculating a processing amount on the basis of the thickness; and performing surface processing on the piezoelectric substrate on the basis of the processing amount by applying a voltage between the first electrode and the second electrode and causing the processing gas to change into plasma.

According to the exemplary embodiments of the present invention, a piezoelectric substrate manufacturing device and a piezoelectric substrate manufacturing method are provided that improve processing accuracy.

DETAILED DESCRIPTION OF EMBODIMENTS

Figure 1:
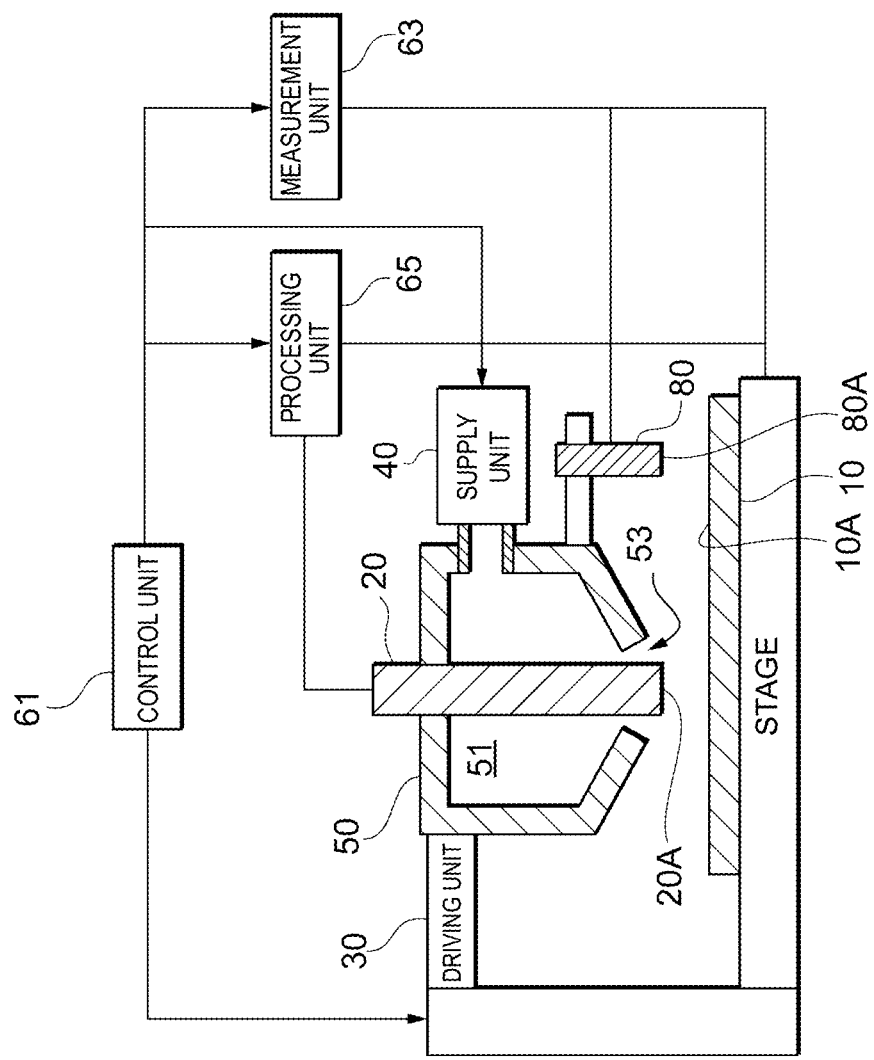
FIG. 1 is a diagram schematically illustrating the configuration of a piezoelectric substrate manufacturing device according to a first exemplary embodiment.

Hereafter, exemplary embodiments of the present invention will be described while referring to the drawings. In the second and subsequent embodiments, constituent elements that are identical or similar to those of the first embodiment are denoted by identical or similar symbols to those in the first embodiment and detailed description thereof is omitted as appropriate. Furthermore, it is noted that description of effects obtained in the second and subsequent embodiments that are the same as in the first embodiment is omitted as appropriate. The drawings for each embodiment are representative, the dimensions and shapes of the individual parts are schematically illustrated, and the technical scope of the invention of the present application should not be interpreted as being limited to that of the embodiments.

First Exemplary Embodiment

First, the configuration of a piezoelectric substrate manufacturing device 100 according to a first exemplary embodiment will be described while referring to FIG. 1. Specifically, FIG. 1 is a diagram schematically illustrating the configuration of a piezoelectric substrate manufacturing device according to the first exemplary embodiment.

As shown, the piezoelectric substrate manufacturing device 100 is a device that performs etching processing using plasma on a piezoelectric substrate. The piezoelectric substrate manufacturing device 100 includes a first electrode 10, a second electrode 20, a third electrode 80, a driving unit 30, a supply unit 40, a cover 50, a control unit 61, a measurement unit 63, and a processing unit 65.

According to an exemplary aspect, the first electrode 10 is a plate-shaped electrode that is provided on a stage of the piezoelectric substrate manufacturing device 100 and corresponds to a lower electrode. At the time of operation, a piezoelectric substrate is arranged on a placement surface 10A of the first electrode 10. Although not illustrated, the first electrode 10 is equipped with a pneumatic chuck for sucking the piezoelectric substrate and holding the piezoelectric substrate in a flat posture.

The second electrode 20 forms a pair with the first electrode 10 and functions as a processing electrode. Specifically, the second electrode 20 has a facing surface 20A that faces the first electrode 10 and is an electrode for forming an electric field between the placement surface 10A of the first electrode 10 and the facing surface 20A of the second electrode 20. The second electrode 20 forms an electric field for causing a processing gas, which is described later, to change into plasma above the piezoelectric substrate and etching the piezoelectric substrate.

The third electrode 80 also forms a pair with the first electrode 10 and corresponds to a detector according to an exemplary aspect of the present disclosure. The third electrode 80 has a facing surface 80A that faces the first electrode 10 and is a measurement electrode for forming an electric field between the placement surface 10A of the first electrode 10 and the facing surface 80A of the third electrode 80. As also shown, the third electrode 80 is provided outside the cover 50 and the relative position of the third electrode 80 with respect to the second electrode 20 is fixed. Thus, the third electrode 80 and the second electrode 20 are fixed relative to each other and can move together relative to the first electrode 10.

It is noted that the shape of the facing surface 80A of the third electrode 80 may be different from the shape of the facing surface 20A of the second electrode 20. With this configuration, the processing accuracy can be improved by giving the facing surface 20A of the second electrode 20 a shape that is suitable for processing and giving the facing surface 80A of the third electrode 80 a shape that is suitable for performing measurement. Moreover, the area value (e.g., surface area) of the facing surface 80A of the third electrode 80 may be different from the area value (e.g., surface area) of the facing surface 20A of the second electrode 20. When the area value of the facing surface 20A is larger than the area value of the facing surface 80A, processing efficiency can be improved and measurement accuracy can be improved. When the area of the facing surface 20A is smaller than the area of the facing surface 80A, processing accuracy can be improved and measurement efficiency can be improved.

An inter-electrode distance between the facing surface 20A of the second electrode 20 and the placement surface 10A of the first electrode 10 is equal to an inter-electrode distance between the facing surface 80A of the third electrode 80 and the placement surface 10A of the first electrode 10. In other words, the facing surface 20A and the facing surface 80A are disposed within the same plane and at a same distance to the placement surface of the first electrode. Consequently, even when the electrode to which a voltage is applied is switched in the measurement step and the processing step, the inter-electrode distance can be maintained constant.

Alternatively, the inter-electrode distance between the facing surface 20A of the second electrode 20 and the placement surface 10A of the first electrode 10 may instead be different from the inter-electrode distance between the facing surface 80A of the third electrode 80 and the placement surface 10A of the first electrode 10. If the respective inter-electrode distances of the measurement electrode and the processing electrode are optimized to the inter-electrode distances required in the measurement step and the processing step, there is no need to move the second electrode 20 and the third electrode 80 in a direction perpendicular to the placement surface 10A of the first electrode 10 when the operation is switched from the measurement step to the processing step. In other words, movement of the second electrode 20 relative to the first electrode 10 can be reduced and processing accuracy can be improved.

The driving unit 30 is configured to change the relative positions of the first electrode 10 and the second electrode 20. The driving unit 30 is a structure that holds the second electrode 20 and the third electrode 80 and moves the second electrode 20 and the third electrode 80 together. The first electrode 10 is a stand on which the piezoelectric substrate is placed and the second electrode 20 and the third electrode 80 are moved. As a result, bending of the piezoelectric substrate can be suppressed and measurement accuracy can be improved. Alternatively, the driving unit 30 may move the first electrode 10 on which the piezoelectric substrate is placed.

The supply unit 40 is composed of, not illustrated a gas cylinder, a pipe, an on-off valve, or the like and is configured to supply a processing gas that changes into plasma. As an example of a processing gas used to etch a crystal substrate is a gas obtained by mixing a carrier gas such as argon (Ar) with a process gas composed of carbon tetrafluoride ($CF_4$) and oxygen ($O_2$), for example. The supply unit 40 is configured to adjust the processing speed by adjusting the mixture ratio of the process gas and the carrier gas and the supply rate of the processing gas. The supply unit 40 may further mix $H_2$ gas with the processing gas and, as a result, may cause the processing speed to be reduced. In other words, it becomes possible to more finely adjust the processing amount of the crystal substrate.

As yet further shown, the cover 50 surrounds the second electrode 20 such that a leading end of the second electrode 20 is exposed from the cover 50 and the cover 50 has an internal space 51 to which the processing gas is supplied from the supply unit 40. The cover 50 has a gap 53 between the cover 50 and the facing surface 20A of the second electrode 20 (i.e., the facing surface 20A extends from gap 53). The processing gas expands in the internal space 51 and flows out from the gap 53 due to the inside of the cover 50 being at a positive pressure with respect to the outside. In other words, the cover 50 corresponds to a nozzle that guides the processing gas to the leading end of the second electrode 20. In the case where the piezoelectric substrate manufacturing device 100 is an open-to-air-type plasma etching device, the cover 50 can suppress diffusion of the processing gas and can improve the use efficiency of the processing gas. In the case where the piezoelectric substrate manufacturing device 100 is a vacuum-sealed-type plasma etching device, diffusion of the processing gas inside a vacuum chamber can be controlled to a prescribed state by the cover 50. That is, the piezoelectric substrate manufacturing device 100 can efficiently generate plasma using the cover 50. Exhaust gas arising from etching is replaced with unreacted processing gas at the leading end of the second electrode 20 by supplying processing gas to the leading end of the second electrode 20 from the gap 53. In other words, uniformity of plasma density can be maintained and processing accuracy can be improved.

The control unit 61 is configured to control the driving unit 30, the supply unit 40, the measurement unit 63, and the processing unit 65, and to perform processing on the piezoelectric substrate. According to an exemplary aspect, the control unit 61 is a microcomputer composed of a CPU, a ROM, a RAM, an input/output interface, and so forth, and is configured to execute software instructions stored on a memory for executing the steps of the manufacturing method as described herein. The control unit 61 is configured to adjust the processing amount such that the thickness of the piezoelectric substrate is uniform, for example. The control unit 61 may set the processing amount such that the thickness of the piezoelectric substrate changes within the piezoelectric substrate. Moreover, the control unit 61 is configured to change the relative positions of the second electrode 20 and the third electrode 80 with respect to the first electrode 10 by controlling the driving unit 30. The control unit 61 is further configured to adjust the amount of processing gas supplied by controlling the supply unit 40. The control unit 61 is further configured to measure the thickness of the piezoelectric substrate by controlling the measurement unit 63. The control unit 61 is yet further configured to perform surface processing on the piezoelectric substrate by controlling the processing unit 65.

The measurement unit 63 is configured to apply a voltage between the first electrode 10 and the third electrode 80 and measures the thickness of the piezoelectric substrate on the basis of a frequency characteristic, which is one type of electrical characteristic. In an exemplary aspect, the measurement unit 63 is composed of an integrated circuit (IC) chip that includes an oscillator, an amplifier, and so on, and corresponds to a measurement circuit. For example, when the piezoelectric substrate is an AT-cut crystal substrate, f=1670/d where d is the thickness of the crystal substrate [m] and f is the frequency [Hz]. In this case, when the frequency f is the frequency of a thickness shear vibration, the thickness d of a crystal substrate can be calculated by measuring the frequency f.

It should be appreciated that the measurement unit 63 is not limited to performing measurements based on a frequency characteristic and may instead perform measurements based on an electrostatic capacitance. At this time, $C=\varepsilon S/d$, where d is the thickness of the piezoelectric substrate [m], S is the area of the facing surface of the measurement electrode [$m^2$], $\varepsilon$ is the dielectric constant of the piezoelectric substrate, and C is the electrostatic capacitance of the piezoelectric substrate [F]. In this case, the thickness d can be calculated by measuring the electrostatic capacitance C. The detector is the third electrode 80 and the method used to measure the thickness is based on an electrical characteristic. Therefore, by using a configuration in which an electrical circuit and so on are shared by the control unit 61, the measurement unit 63, and the processing unit 65, the configuration of the piezoelectric substrate manufacturing device 100 can be simplified.

The processing unit 65 is configured to perform surface processing on the piezoelectric substrate by applying power between the first electrode 10 and the second electrode 20 and causing the processing gas to change into plasma. The processing unit 65 is, for example, composed of an IC chip and corresponds to a processing circuit. In other words, the processing unit 65 performs etching processing using plasma. The processing unit 65 applies a high-frequency voltage of, for example, 13.56 MHz between the first electrode 10 and the third electrode 80. As a result, F radicals generated by $CF_4$ plasma react with Si in $SiO_2$, forming $SiF_4$ having a high steam pressure, which is then exhausted. At the same time, oxygen in the $SiO_2$ is exhausted as $CO_x$. Additionally, an ion sheath is formed in the vicinity of the surface of the piezoelectric substrate and positive ions collide with the surface of the piezoelectric substrate. This promotes chemical reaction of radicals and detachment of reaction products, and causes particles to be generated via sputter etching. Therefore, in the processing step, sources of contamination such as exhaust gas and particles being processed are scattered from the region.

As described above, in the measurement step, the third electrode 80 is positioned by the driving unit 30 controlled by the control unit 61 and in the processing step, similarly, the second electrode 20 is positioned by the driving unit 30 controlled by the control unit 61. Therefore, positioning errors generated in the measurement step and the processing step can be reduced and processing accuracy can be improved.

As also described above, in the piezoelectric substrate manufacturing device 100, the third electrode (i.e., the detector) 80 is provided outside the cover 50. Therefore, contamination of the third electrode 80 caused by etching processing using plasma can be prevented by the cover 50 and a reduction in measurement accuracy can be suppressed. Furthermore, since components such as the control circuit are used in both the measurement step and the processing step, the configuration of the piezoelectric substrate manufacturing device 100 can be simplified.

Figure 2:
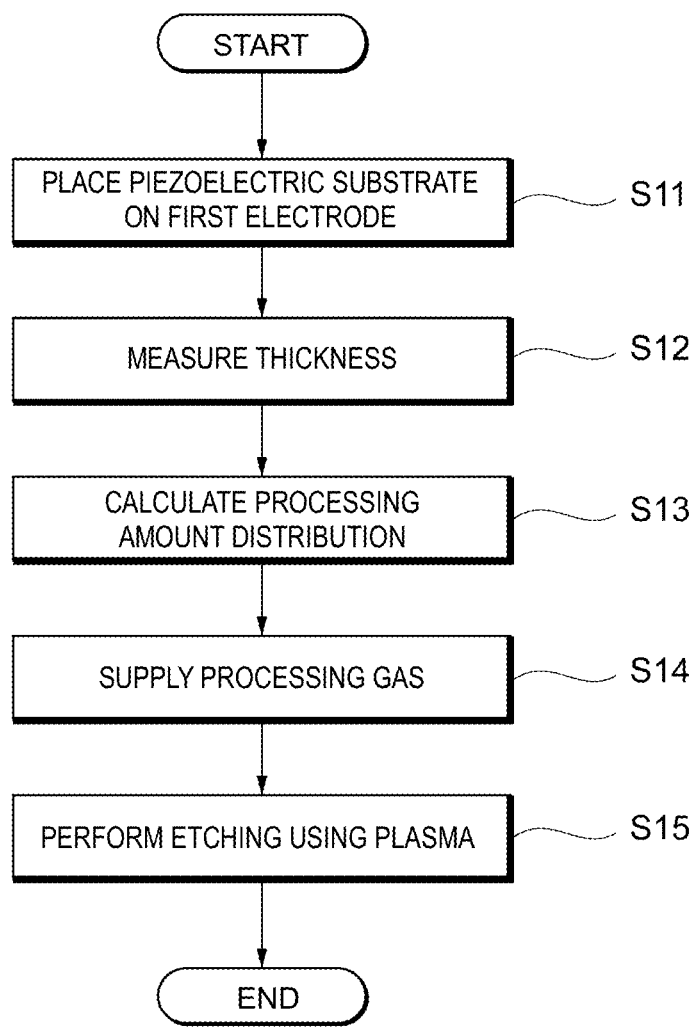
FIG. 2 is a flowchart schematically illustrating a piezoelectric substrate manufacturing method in which the piezoelectric substrate manufacturing device according to the first exemplary embodiment is used.
Figure 3:
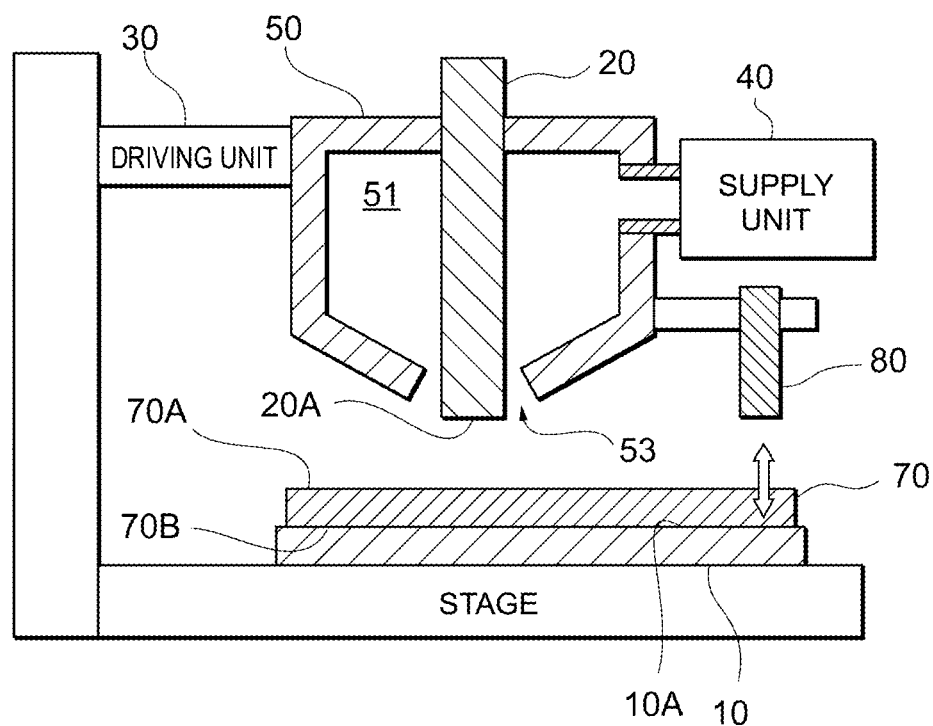
FIG. 3 is a diagram schematically illustrating a measurement step for measuring the thickness of a piezoelectric substrate.
Figure 4:
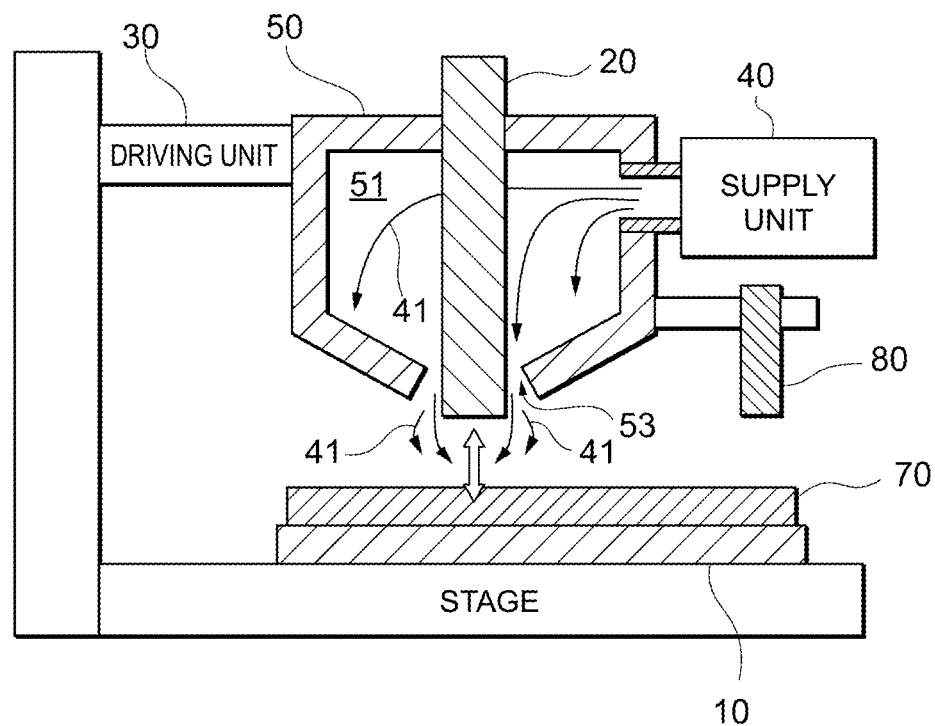
FIG. 4 is a diagram schematically illustrating a processing step for etching a piezoelectric substrate using plasma.

Next, a piezoelectric substrate manufacturing method in which the piezoelectric substrate manufacturing device 100 according to the first embodiment is used will be described while referring to FIGS. 2 to 4. FIG. 2 is a flowchart schematically illustrating a piezoelectric substrate manufacturing method in which the piezoelectric substrate manufacturing device according to the first embodiment is used. FIG. 3 is a diagram schematically illustrating a measurement step for measuring the thickness of a piezoelectric substrate. FIG. 4 is a diagram schematically illustrating a processing step for etching a piezoelectric substrate using plasma.

First, a piezoelectric substrate 70 is placed on the first electrode 10 (S11). As illustrated in FIG. 3, the piezoelectric substrate 70 is arranged between the first electrode 10 and the second electrode 20. Moreover, the piezoelectric substrate 70 has a pair of main surfaces 70A and 70B that face/oppose each other, and is arranged such that one main surface 70B contacts the first electrode 10 and the other main surface 70A faces the second electrode 20 with a gap therebetween.

Next, the thickness is measured (S12). To do so, a voltage is applied between the first electrode 10 and the third electrode 80 and the frequency is measured. The thickness of a measurement region 71 is calculated on the basis of the detected frequency. Once measurement in one measurement region is complete, the third electrode 80 is moved by the driving unit 30 and the thickness in another measurement region is measured. In this way, a thickness distribution of the piezoelectric substrate 70 is measured by repeatedly performing measurement and movement for difference measurement regions of the piezoelectric substrate 70.

Next, a processing amount distribution is calculated (S13). A required processing amount distribution is calculated from the thickness distribution of the piezoelectric substrate 70 prior to processing as measured in the step S12 and a target value of the thickness of the piezoelectric substrate 70 that is to be manufactured.

Next, a processing gas 41 is supplied (S14). As illustrated in FIG. 4, the supply unit 40 supplies the processing gas 41 to the internal space 51 of the cover 50, such that the processing gas 41 fills the internal space 51 and is supplied to the region above the main surface 70B of the piezoelectric substrate 70 via the gap 53. The region above the piezoelectric substrate 70 referred to herein corresponds to a region between the main surface 70B of the piezoelectric substrate 70 and the facing surface 20A of the second electrode 20. The rate at which the processing gas 41 is supplied to the region above the main surface 70B of the piezoelectric substrate 70 is determined by the internal pressure of the internal space 51 and the cross-sectional area of the gap 53.

Next, etching is performed using plasma (S15). To do so, a voltage is applied between the first electrode 10 and the second electrode 20 and the processing gas 41 is changed into plasma. The main surface 70A in a processing region 73 is subjected to etching processing on the basis of the processing amount distribution calculated in step S13. Once the etching processing in one processing region is complete, the second electrode 20 is moved by the driving unit 30 and etching processing is performed in another processing region. In this way, the thickness distribution of the piezoelectric substrate 70 is brought close to a target value by repeatedly performing step S25 and step S26.

Second Exemplary Embodiment

Figure 5:
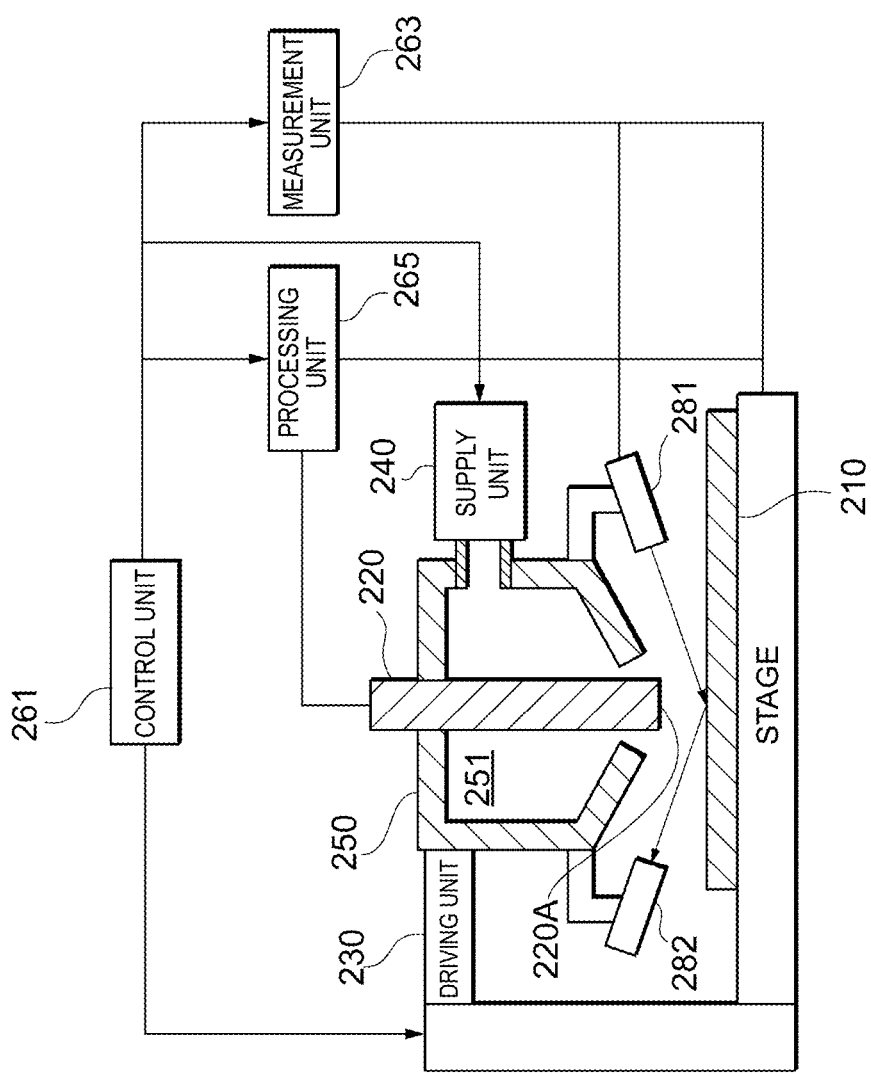
FIG. 5 is a diagram schematically illustrating the configuration of a piezoelectric substrate manufacturing device according to a second exemplary embodiment.

A piezoelectric substrate manufacturing device 200 according to a second exemplary embodiment will be described while referring to FIG. 5. FIG. 5 is a diagram schematically illustrating the configuration of the piezoelectric substrate manufacturing device according to the second exemplary embodiment.

Similarly to the piezoelectric substrate manufacturing device 100 according to the first embodiment described above, the piezoelectric substrate manufacturing device 200 according to the second embodiment includes a first electrode 210, a second electrode 220, a driving unit 230, a supply unit 240, a cover 250, a control unit 261, a measurement unit 263, and a processing unit 265. In addition, the second electrode 220 has a facing surface 220A. However, the piezoelectric substrate manufacturing device 200 according to the second embodiment differs from the piezoelectric substrate manufacturing device 100 according to the first embodiment in that the piezoelectric substrate manufacturing device 200 includes a light-emitting unit 281 and a light-receiving unit 282 instead of the third electrode 80.

The light-emitting unit 281 and the light-receiving unit 282 correspond to a detector according to an exemplary aspect. The light-emitting unit 281 radiates light onto the piezoelectric substrate 70. The light-receiving unit 282 receives light reflected by the piezoelectric substrate 70 out of the radiated light. In the piezoelectric substrate manufacturing device 200, the thickness of the piezoelectric substrate can be measured in a non-contact manner by dispersing or diffracting this reflected light.

The light radiated from the light-emitting unit 281 and the reflected light received by the light-receiving unit 282 may have a linear shape or may have a planar shape. Thus, the efficiency with which the thickness of the piezoelectric substrate is measured can be improved.

Third Exemplary Embodiment

Figure 6:
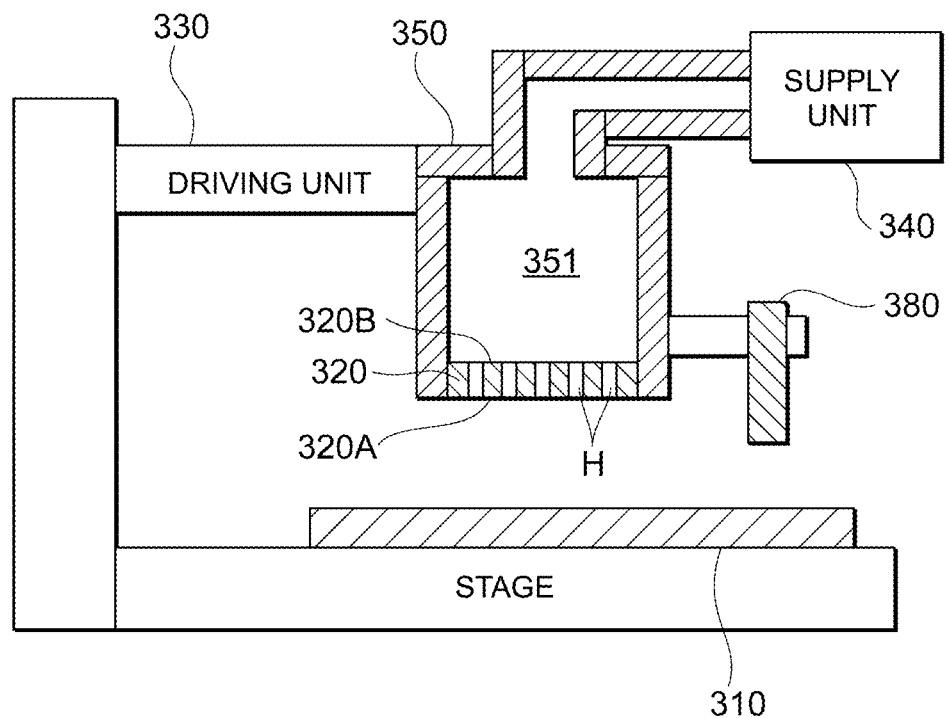
FIG. 6 is a diagram schematically illustrating the configuration of a piezoelectric substrate manufacturing device according to a third exemplary embodiment.
Figure 7:
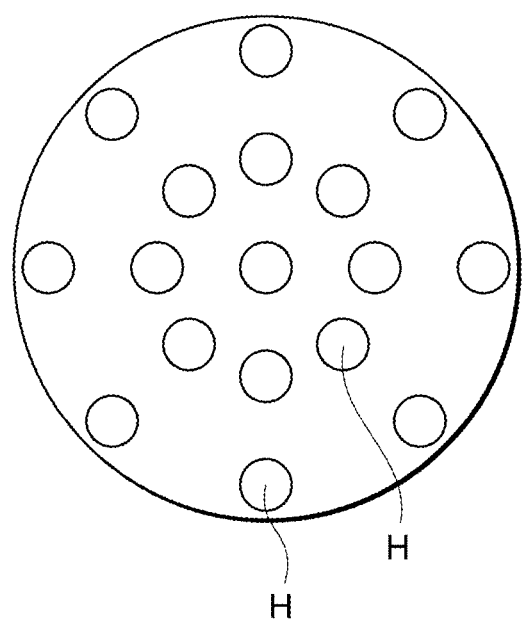
FIG. 7 is a plan view schematically illustrating the configuration of a second electrode according to the third exemplary embodiment when a facing surface of the second electrode is viewed in a plan view.

A piezoelectric substrate manufacturing device 300 according to a third exemplary embodiment will be described while referring to FIGS. 6 and 7. FIG. 6 is a diagram schematically illustrating the configuration of the piezoelectric substrate manufacturing device according to the third embodiment. FIG. 7 is a plan view schematically illustrating the configuration of a second electrode according to the third exemplary embodiment when a facing surface of the second electrode is viewed in a plan view.

Similarly to the piezoelectric substrate manufacturing device 100 according to the first embodiment, the piezoelectric substrate manufacturing device 300 according to the third embodiment includes a first electrode 310, a third electrode 380, a driving unit 330, a supply unit 340, a cover 350, a control unit 361, a measurement unit 363, and a processing unit 365. However, the piezoelectric substrate manufacturing device 300 according to the third embodiment differs from the piezoelectric substrate manufacturing device 100 according to the first embodiment in that one or more through holes H are formed in a second electrode 320.

In this exemplary aspect, the through holes H penetrate from an inside-facing surface 320B, which is on an internal space 351 side, of the second electrode 320 to a facing surface 320A, which is on the first electrode 310 side, of the second electrode 320 and that faces the first electrode 310. The through holes H supply the processing gas supplied from the supply unit 340 to the internal space 351 of the cover 350 between the first electrode 310 and the second electrode 320. In order to uniformly supply the processing gas, it is preferable that the sectional area of each through hole H be small and in a plan view of the facing surface 320A of the second electrode 320 and that the number of through holes H be large. As a result, the uniformity of the density of the processing gas between the first electrode 310 and the second electrode 320 can be improved. It should be appreciated that the shape of the through holes H is not particularly limited and can be appropriately designed to have a cylindrical shape, a slit shape, a porous-like form, or the like, or to have a shape that is a combination of such shapes.

As described above, according to an exemplary aspect of the present invention, the piezoelectric substrate manufacturing device 100 includes the first electrode 10; the second electrode 20 that faces the first electrode 10 with a piezoelectric substrate interposed therebetween; the cover 50 that surrounds the second electrode 20 such that the leading end of the second electrode 20 is exposed; and the supply unit 40 that supplies a processing gas to the internal space 51 of the cover 50. Moreover, the manufacturing device 100 includes the processing unit 65 that performs surface processing on the piezoelectric substrate by applying a voltage between the first electrode 10 and the second electrode 20 and causing the processing gas to change into plasma; a detector that is provided outside the cover 50, a relative position of the detector with respect to the second electrode 20 being fixed; the measurement unit 63 that measures the thickness of the piezoelectric substrate using the detector; the driving unit 30 that changes the relative positions of the first electrode 10 and the second electrode 20; and the control unit 61 that controls the supply unit 40, the processing unit 65, the measurement unit 63, and the driving unit 30.

According to the above-described exemplary aspect, the relative positions of the detector, which is for measuring the thickness of the piezoelectric substrate, and the second electrode, which is for performing etching processing on the piezoelectric substrate using plasma, are fixed and are positioned by the same driving unit that is driven by the same control unit. Therefore, positioning errors generated in the measurement step and the processing step can be reduced and processing accuracy can be improved. Furthermore, a reduction in measurement accuracy caused by contamination of the detector can be suppressed and the processing accuracy can be improved by providing the detector outside the cover.

In the above-described piezoelectric substrate manufacturing device, the detector can include the third electrode 80, and the measurement unit 63 can be configured to apply a voltage between the first electrode 10 and the third electrode 80 and to measure the thickness of the piezoelectric substrate on the basis of an electrical characteristic. In this way, the configuration of the piezoelectric substrate manufacturing device can be simplified by making common use of circuits and so forth.

In the above-described piezoelectric substrate manufacturing device, the shape of the facing surface 80A of the third electrode 80 that faces the first electrode 10 may be different from the shape of the facing surface 20A of the second electrode 20 that faces the first electrode 10. With this configuration, the processing accuracy can be improved by giving the facing surface 20A of the second electrode 20 a shape that is suitable and configured for performing processing and giving the facing surface 80A of the third electrode 80 a shape that is suitable for measurement.

In the above-described piezoelectric substrate manufacturing device, the area of the facing surface 20A of the second electrode 20 that faces the first electrode 10 may be larger than the area of the facing surface of the third electrode 80 that faces the first electrode 10. With this configuration, the processing efficiency can be improved and the measurement accuracy can be improved.

Alternatively, in the above-described piezoelectric substrate manufacturing device, the area of the facing surface 20A of the second electrode 20 that faces the first electrode 10 may be smaller than the area of the facing surface of the third electrode 80 that faces the first electrode 10. With this configuration, processing accuracy can be improved and measurement efficiency can be improved.

In the above-described piezoelectric substrate manufacturing device, the distance between the facing surface 20A, which faces the first electrode 10, of the second electrode 20 and the first electrode 10 can be equal to the distance between the facing surface 80A, which faces the first electrode 10, of the third electrode 80, and the first electrode 10. Consequently, even when the electrode to which a voltage is applied is switched in the measurement step and the processing step, the inter-electrode distance can be maintained constant.

Alternatively, in the above-described piezoelectric substrate manufacturing device, the distance between the facing surface 20A, which faces the first electrode 10, of the second electrode 20 and the first electrode 10 may be different from the distance between the facing surface 80A, which faces the first electrode 10, of the third electrode 80, and the first electrode 10. With this configuration, movement of the second electrode relative to the first electrode can be reduced and processing accuracy can be improved.

In the above-described piezoelectric substrate manufacturing device, the detector can include the light-emitting unit 281 that radiates light onto the piezoelectric substrate and the light-receiving unit 282 that receives reflected light reflected by the piezoelectric substrate out of the radiated light. Moreover, the measurement unit 263 can be configured to measure the thickness of the piezoelectric substrate by dispersing or diffracting the reflected light. With this configuration, the thickness of the piezoelectric substrate can be measured in a non-contact manner.

In the above-described piezoelectric substrate manufacturing device, the light-emitting unit 281 can radiate light in a linear shape and the light-receiving unit 282 can receive reflected light reflected in a linear shape. With this configuration, measurement efficiency can be improved.

In the above-described piezoelectric substrate manufacturing device, the light-emitting unit 281 can radiate light in a planar shape and the light-receiving unit 282 can receive reflected light reflected in a planar shape. With this configuration, measurement efficiency can be improved.

In the above-described piezoelectric substrate manufacturing device, the cover 50 can have the gap 53 between the cover 50 and the facing surface 20A of the second electrode 20 that faces the first electrode 10. With this configuration, the processing gas can be supplied such that exhaust gas arising from etching is replaced with non-reacted processing gas. In other words, uniformity of plasma density can be maintained and processing accuracy can be improved. Therefore, the piezoelectric substrate manufacturing device can efficiently generate plasma.

In the above-described piezoelectric substrate manufacturing device, the second electrode 320 can include at least one through hole H. With this configuration, the uniformity of the density of the processing gas between the first electrode and the second electrode can be improved.

In the above-described piezoelectric substrate manufacturing device, a piezoelectric substrate can be arranged on the first electrode 10 and the second electrode 20 and the detector can be held and moved by the driving unit 30. With this configuration, bending of the piezoelectric substrate can be suppressed and the measurement accuracy can be improved.

In the above-described piezoelectric substrate manufacturing device, the piezoelectric substrate can be a crystal substrate according to an exemplary aspect.

According to another exemplary aspect of the present invention, the piezoelectric substrate manufacturing method includes arranging a piezoelectric substrate between the first electrode 10 and the second electrode 20; measuring the thickness of the piezoelectric substrate using the detector that is provided outside the cover 50, which covers the second electrode 20 such that the leading end of the second electrode 20 is exposed, and with a relative position of the detector with respect to the second electrode 20 being fixed; calculating a processing amount on the basis of the thickness; and performing surface processing on the piezoelectric substrate on the basis of the processing amount by applying a voltage between the first electrode 10 and the second electrode 20 and causing the processing gas to change into plasma.

According to the above-described exemplary aspect, the relative positions of the detector, which is for measuring the thickness of the piezoelectric substrate, and the second electrode, which is for performing etching processing on the piezoelectric substrate using plasma, are fixed relative to each other and are positioned by the same driving unit that is driven by the same control unit. Therefore, positioning errors generated in the measurement step and the processing step can be reduced and processing accuracy can be improved. Furthermore, a reduction in measurement accuracy caused by contamination of the detector can be suppressed and the processing accuracy can be improved by providing the detector outside the cover.

In the above-described piezoelectric substrate manufacturing method, the detector can include the third electrode 80, and in the step of measuring the thickness, a voltage can be applied between the first electrode 10 and the third electrode 80 and the thickness of the piezoelectric substrate can be measured on the basis of an electrical characteristic. In this way, the configuration of the piezoelectric substrate manufacturing device can be simplified by making common use of circuits and so forth.

In the above-described piezoelectric substrate manufacturing method, the shape of the facing surface 80A of the third electrode 80 that faces the first electrode 10 can be different from the shape of the facing surface 20A of the second electrode 20 that faces the first electrode 10. With this configuration, the processing accuracy can be improved by giving the facing surface 20A of the second electrode 20 a shape that is suitable for performing processing and giving the facing surface 80A of the third electrode 80 a shape that is suitable for measurement.

In the above-described piezoelectric substrate manufacturing method, the area of the facing surface 20A of the second electrode 20 that faces the first electrode 10 can be larger than the area of the facing surface of the third electrode 80 that faces the first electrode 10. With this configuration, the processing efficiency can be improved and the measurement accuracy can be improved.

Alternatively, in the above-described piezoelectric substrate manufacturing method, the area of the facing surface 20A of the second electrode 20 that faces the first electrode 10 can be smaller than the area of the facing surface of the third electrode 80 that faces the first electrode 10. With this configuration, processing accuracy can be improved and measurement efficiency can be improved.

In the above-described piezoelectric substrate manufacturing method, the distance between the facing surface 20A, which faces the first electrode 10, of the second electrode 20 and the first electrode 10 can be equal to the distance between the facing surface 80A, which faces the first electrode 10, of the third electrode 80, and the first electrode 10. Consequently, even when the electrode to which a voltage is applied is switched in the measurement step and the processing step, the inter-electrode distance can be maintained constant.

In the above-described piezoelectric substrate manufacturing method, the distance between the facing surface 20A, which faces the first electrode 10, of the second electrode 20 and the first electrode 10 can be different from the distance between the facing surface 80A, which faces the first electrode 10, of the third electrode 80, and the first electrode 10. With this configuration, movement of the second electrode relative to the first electrode can be reduced and processing accuracy can be improved.

In the above-described piezoelectric substrate manufacturing method, the detector can include the light-emitting unit 281 and the light-receiving unit 282, and the step of measuring the thickness can include a step of radiating light from the light-emitting unit 281 onto the piezoelectric substrate, a step of receiving in the light-receiving unit 282 reflected light reflected by the piezoelectric substrate out of the radiated light, and a step of measuring the thickness of the piezoelectric substrate on the basis of the reflected light. With this configuration, the thickness of the piezoelectric substrate can be measured in a non-contact manner.

In the above-described piezoelectric substrate manufacturing method, the light-emitting unit 281 can radiate light in a linear shape and the light-receiving unit 282 can receive reflected light reflected in a linear shape. With this configuration, measurement efficiency can be improved.

In the above-described piezoelectric substrate manufacturing method, the light-emitting unit 281 can radiate light in a planar shape and the light-receiving unit 282 can receive reflected light reflected in a planar shape. With this configuration, measurement efficiency can be improved.

In the above-described piezoelectric substrate manufacturing method, the cover 50 can have the gap 53 between the cover 50 and the facing surface 20A of the second electrode 20 that faces the first electrode 10. With this configuration, the processing gas can be supplied such that exhaust gas arising from etching is replaced with non-reacted processing gas. In other words, uniformity of plasma density can be maintained and processing accuracy can be improved. Therefore, the piezoelectric substrate manufacturing device can efficiently generate plasma.

In the above-described piezoelectric substrate manufacturing method, the second electrode 320 can include at least one through hole H. With this configuration, the uniformity of the density of the processing gas between the first electrode and the second electrode can be improved.

In the above-described piezoelectric substrate manufacturing method, the piezoelectric substrate can be arranged on the first electrode 10, and the second electrode 20 and the detector may be held and moved by the driving unit 30 that changes the relative positions of the first electrode 10 and the second electrode 20. With this configuration, bending of the piezoelectric substrate can be suppressed and the measurement accuracy can be improved.

In the above-described piezoelectric substrate manufacturing method, the piezoelectric substrate can be a crystal substrate according to an exemplary aspect.

As described above, according to exemplary aspects of the present invention, there can be provided a piezoelectric substrate manufacturing device and a piezoelectric substrate manufacturing method which can improve processing accuracy.

In general, it is noted that the purpose of the exemplary embodiments described above is to enable easy understanding of the present invention and the embodiments are not to be interpreted as limiting the present invention. The exemplary embodiments can be modified or improved without departing from the gist of the invention and equivalents to the present invention are also included in the exemplary embodiments. In other words, appropriate design changes made to the embodiments by one skilled in the art are included in the scope of the present invention so long as the changes have the characteristics of the present invention. For example, the elements included in the embodiments and the arrangements, materials, conditions, shapes, sizes and so forth of the elements are not limited to those exemplified in the embodiments and can be changed as appropriate. In addition, the elements included in the embodiments can be combined as much as technically possible and such combined elements are also included in the scope of the present invention so long as the combined elements have the characteristics of the present invention.

REFERENCE SIGNS LIST 100 piezoelectric substrate manufacturing device
10 first electrode
20 second electrode
80 third electrode (detector)
30 driving unit
40 supply unit
50 cover
61 control unit
63 measurement unit
65 processing unit

The invention claimed is:

1. A piezoelectric substrate manufacturing device comprising:
   a first electrode;
   a second electrode that faces the first electrode with a space therebetween;
   a cover that surrounds the second electrode such that a leading end of the second electrode is exposed from the cover;
   a supply unit configured to supply a processing gas to an internal space of the cover;
   a detector disposed outside the cover, the detector having a fixed position relative to a position of the second electrode;
   a measurement unit configured to measure a thickness of a piezoelectric substrate positioned between the first and second electrodes based on a measurement signal detected by the detector;
   a processing unit configured to perform surface processing on the piezoelectric substrate, based on the measured thickness, by applying a voltage between the first and second electrodes and causing the processing gas to change into plasma; and
   a driving unit configured to change relative positions of the first electrode and the second electrode.

2. The piezoelectric substrate manufacturing device according to claim 1, further comprising a control unit including a processor and configured to control the supply unit, the processing unit, the measurement unit, and the driving unit.

3. The piezoelectric substrate manufacturing device according to claim 1, wherein the detector includes a third electrode, and the measurement unit is configured to apply a voltage between the first electrode and the third electrode and to measure the thickness of the piezoelectric substrate based on an electrical characteristic as the measurement signal detected by the detector.

4. The piezoelectric substrate manufacturing device according to claim 3, wherein a surface of the third electrode that faces the first electrode comprises a shape that is different from a shape of a surface of the second electrode that faces the first electrode.

5. The piezoelectric substrate manufacturing device according to claim 4, wherein the surface of the second electrode that faces the first electrode comprises a surface area that is larger than a surface area of the surface of the third electrode that faces the first electrode.

6. The piezoelectric substrate manufacturing device according to claim 4, wherein the surface of the second electrode that faces the first electrode comprises a surface area that is smaller than a surface area of the surface of the third electrode that faces the first electrode.

7. The piezoelectric substrate manufacturing device according to claim 3, wherein a distance between the first electrode and a surface of the second electrode that faces the first electrode is equal to a distance between the first electrode and a surface of the third electrode that faces the first electrode.

8. The piezoelectric substrate manufacturing device according to claim 3, wherein a distance between the first electrode and a surface of the second electrode that faces the first electrode is different from a distance between the first electrode and a surface of the third electrode that faces the first electrode.

9. The piezoelectric substrate manufacturing device according to claim 3, wherein the electrical characteristic is a frequency detected when the voltage is applied between the first and third electrodes.

10. The piezoelectric substrate manufacturing device according to claim 1,
    wherein the detector includes a light-emitting unit configured to radiate light onto the piezoelectric substrate and a light-receiving unit configured to receive light reflected by the piezoelectric substrate out of the radiated light, and
    wherein the measurement unit is configured to measure the thickness of the piezoelectric substrate by dispersing or diffracting the reflected light received by the light-receiving unit.

11. The piezoelectric substrate manufacturing device according to claim 10, wherein the light-emitting unit is configured to radiate the light in a linear shape, and the light-receiving unit is configured to receive the light reflected in a linear shape.

12. The piezoelectric substrate manufacturing device according to claim 10, wherein the light-emitting unit is configured to radiate the light in a planar shape, and the light-receiving unit is configured to receive the light reflected in a planar shape.

13. The piezoelectric substrate manufacturing device according to claim 1, wherein the cover includes a gap between the cover and a surface of the second electrode that faces the first electrode.

14. The piezoelectric substrate manufacturing device according to claim 1, wherein the second electrode includes at least one through hole.

15. The piezoelectric substrate manufacturing device according to claim 1, wherein the piezoelectric substrate is disposed on the first electrode, and the second electrode and the detector are held and moved by the driving unit.

16. The piezoelectric substrate manufacturing device according to claim 1, wherein the piezoelectric substrate is a crystal substrate.

17. A piezoelectric substrate manufacturing method comprising:
    arranging a piezoelectric substrate between a first electrode and a second electrode, with a cover disposed to cover the second electrode such that a leading end of the second electrode is exposed therefrom;
    measuring a thickness of the piezoelectric substrate using a detector that is disposed outside the cover that covers the second electrode, the detector having a position that is fixed relative to a position of the second electrode;

calculating a processing amount based on the measured thickness of the piezoelectric substrate; and performing surface processing on the piezoelectric substrate based on the calculated processing amount by applying a voltage between the first electrode and the second electrode and causing a processing gas supplied to an internal space of the cover to change into plasma.

18. The piezoelectric substrate manufacturing method according to claim 17, wherein the detector includes a third electrode, and the measuring of the thickness of the piezoelectric substrate comprises applying a voltage between the first and third electrodes and measuring the thickness of the piezoelectric substrate based on an electrical characteristic in response to the applied voltage.

19. The piezoelectric substrate manufacturing method according to claim 18, wherein a surface of the third electrode that faces the first electrode comprises a shape that is different from a shape of a surface of the second electrode that faces the first electrode.

20. The piezoelectric substrate manufacturing method according to claim 19, wherein the surface of the second electrode that faces the first electrode comprises a surface area that is larger than a surface area of the surface of the third electrode that faces the first electrode.

21. The piezoelectric substrate manufacturing method according to claim 19, wherein the surface of the second electrode that faces the first electrode comprises a surface area that is smaller than a surface area of the surface of the third electrode that faces the first electrode.

22. The piezoelectric substrate manufacturing method according to claim 18, wherein a distance between the first electrode and a surface of the second electrode that faces the first electrode is equal to a distance between the first electrode and a surface of the third electrode that faces the first electrode.

23. The piezoelectric substrate manufacturing method according to claim 18, wherein a distance between the first electrode and a surface of the second electrode that faces the first electrode is different from a distance between the first electrode and a surface of the third electrode that faces the first electrode.

24. The piezoelectric substrate manufacturing method according to claim 18, wherein the measuring of the thickness of the piezoelectric substrate further comprises detecting the electrical characteristic as a frequency when the voltage is applied between the first and third electrodes.

25. The piezoelectric substrate manufacturing method according to claim 17, wherein the detector includes a light-emitting unit and a light-receiving unit, and the measuring of the thickness of the piezoelectric substrate comprises:

radiating light from the light-emitting unit onto the piezoelectric substrate;

receiving light by the light-receiving unit that is reflected by the piezoelectric substrate out of the radiated light; and measuring the thickness of the piezoelectric substrate based on the reflected light received by the light-receiving unit.

26. The piezoelectric substrate manufacturing method according to claim 25, wherein the radiating and the receiving further comprises:

radiating, from the light-emitting unit, the light in a linear shape; and receiving, by the light-receiving unit, the light reflected in a linear shape.

27. The piezoelectric substrate manufacturing method according to claim 25, wherein the radiating and the receiving further comprises:

radiating, from the light-emitting unit, the light in a planar shape; and receiving, by the light-receiving unit, the light reflected in a planar shape.

28. The piezoelectric substrate manufacturing method according to claim 17, further comprising providing the cover with a gap between the cover and a surface of the second electrode that faces the first electrode.

29. The piezoelectric substrate manufacturing method according to claim 17, wherein the second electrode includes at least one through hole.

30. The piezoelectric substrate manufacturing method according to claim 17, wherein the arranging of the piezoelectric substrate further comprises arranging the piezoelectric substrate on the first electrode; and wherein the method further comprises holding and moving the second electrode and the detector by a driving unit to change relative positions of the first electrode and the second electrode.

31. The piezoelectric substrate manufacturing method according to claim 17, wherein the piezoelectric substrate is a crystal substrate.

32. The piezoelectric substrate manufacturing method according to claim 17, wherein the performing of the surface processing further comprises etching the piezoelectric substrate by the plasma to performing the surface processing of the piezoelectric substrate.

* * * * *